United States Patent
Sanuki et al.

(10) Patent No.: US 11,417,642 B2
(45) Date of Patent: Aug. 16, 2022

(54) SEMICONDUCTOR STORAGE DEVICE

(71) Applicant: KIOXIA CORPORATION, Tokyo (JP)

(72) Inventors: Tomoya Sanuki, Yokkaichi Mie (JP); Toshio Fujisawa, Yokohama Kanagawa (JP); Hiroshi Maejima, Setagaya Tokyo (JP); Takashi Maeda, Kamakura Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/006,378

(22) Filed: Aug. 28, 2020

(65) Prior Publication Data
US 2021/0272946 A1 Sep. 2, 2021

(30) Foreign Application Priority Data
Mar. 2, 2020 (JP) .............................. JP2020-035101

(51) Int. Cl.
| | |
|---|---|
| *G11C 16/04* | (2006.01) |
| *H01L 25/18* | (2006.01) |
| *H01L 23/00* | (2006.01) |
| *G11C 16/10* | (2006.01) |
| *G11C 16/26* | (2006.01) |
| *G11C 16/30* | (2006.01) |
| *G06F 3/06* | (2006.01) |

(52) U.S. Cl.
CPC ............ *H01L 25/18* (2013.01); *G06F 3/0604* (2013.01); *G06F 3/0659* (2013.01); *G06F 3/0679* (2013.01); *G11C 16/10* (2013.01); *G11C 16/26* (2013.01); *G11C 16/30* (2013.01); *H01L 24/13* (2013.01); *H01L 24/16* (2013.01); *H01L 24/48* (2013.01); *H01L 24/73* (2013.01); *G11C 16/0483* (2013.01); *H01L 2224/13016* (2013.01); *H01L 2224/16057* (2013.01); *H01L 2224/16145* (2013.01); *H01L 2224/48106* (2013.01); *H01L 2224/48145* (2013.01); *H01L 2224/73207* (2013.01)

(58) Field of Classification Search
CPC .... G06F 3/0604; G06F 3/0659; G06F 3/0679; H01L 25/18; H01L 24/13; H01L 24/73; H01L 24/48; G11C 16/10; G11C 16/26; G11C 16/30
See application file for complete search history.

(56) References Cited

U.S. PATENT DOCUMENTS

| | | | |
|---|---|---|---|
| 10,090,315 B2 | 10/2018 | Fukuzumi et al. | |
| 10,297,578 B2 | 5/2019 | Tagami et al. | |
| 10,410,995 B2 * | 9/2019 | Kinoshita | ........... H01L 25/0657 |

(Continued)

FOREIGN PATENT DOCUMENTS

| | | | |
|---|---|---|---|
| JP | 2008-300469 A | 12/2008 | |
| JP | 2016-062901 A | 4/2016 | |

*Primary Examiner* — Pho M Luu
(74) *Attorney, Agent, or Firm* — Kim & Stewart LLP

(57) ABSTRACT

A semiconductor storage device includes a plurality of memory chips and a circuit chip. The plurality of memory chips and the circuit chip are stacked on each other. Each of the plurality of memory chips has a memory cell array that includes a plurality of memory cells. The circuit chip includes a data latch configured to store page data for writing or reading data into or from the memory cell array of each of the memory chips.

18 Claims, 13 Drawing Sheets

(56) References Cited

U.S. PATENT DOCUMENTS

| | | | |
|---|---|---|---|
| 2006/0233012 A1* | 10/2006 | Sekiguchi | H01L 24/50 365/51 |
| 2009/0153229 A1 | 6/2009 | Hanke et al. | |
| 2018/0358371 A1 | 12/2018 | Hwang et al. | |
| 2019/0043836 A1 | 2/2019 | Fastow et al. | |
| 2020/0006423 A1* | 1/2020 | Lin | G11C 11/1675 |
| 2021/0242175 A1* | 8/2021 | Kim | H01L 25/18 |

* cited by examiner

SEMICONDUCTOR STORAGE DEVICE

CROSS-REFERENCE TO RELATED APPLICATION(S)

This application is based upon and claims the benefit of priority from Japanese Patent Application No. 2020-035101, filed on Mar. 2, 2020, the entire contents of which are incorporated herein by reference.

FIELD

Embodiments described herein relate generally to a semiconductor storage device.

BACKGROUND

A semiconductor storage device in which an array chip with memory cells is bonded to a circuit chip with a control circuit to control the memory cells is known.

DETAILED DESCRIPTION

Embodiments provide a semiconductor storage device having a low manufacturing cost per storage capacity (cost per bit).

In general, according to an embodiment, a semiconductor storage device includes a plurality of memory chips and a circuit chip. The plurality of memory chips and the circuit chip are stacked on each other in a stacking direction. Each of the memory chips has a memory cell array that includes a plurality of memory cells. The circuit chip includes a data latch configured to store page data for writing or reading data into or from the memory cell array of each of the memory chips.

Hereinafter, a semiconductor storage device according to example embodiments will be described with reference to the drawings. In the following description, components having the same or substantially similar function are denoted by the same reference symbols. The description such repeated the components may be omitted. In general, the drawings are schematic or conceptual, and, as such, any depicted relationship between dimensions, such as thickness and width of each depicted aspect, dimensional ratios between depicted portions, and the like are not necessarily the same as the actual ones.

An x-direction, a y-direction, and a z-direction will be defined for descriptive purposes. The x-direction and the y-direction are substantially parallel to a surface of a memory chip (see FIG. 2). The x-direction is a direction in an xy plane. The y-direction is perpendicular to the x-direction. The z-direction is substantially perpendicular to the x-direction and the y-direction. The z-direction may be referred to as a stacking direction. The above expressions are just for convenience and do not necessarily correspond to the direction of gravity or the like.

Example Embodiment

Figure 1:
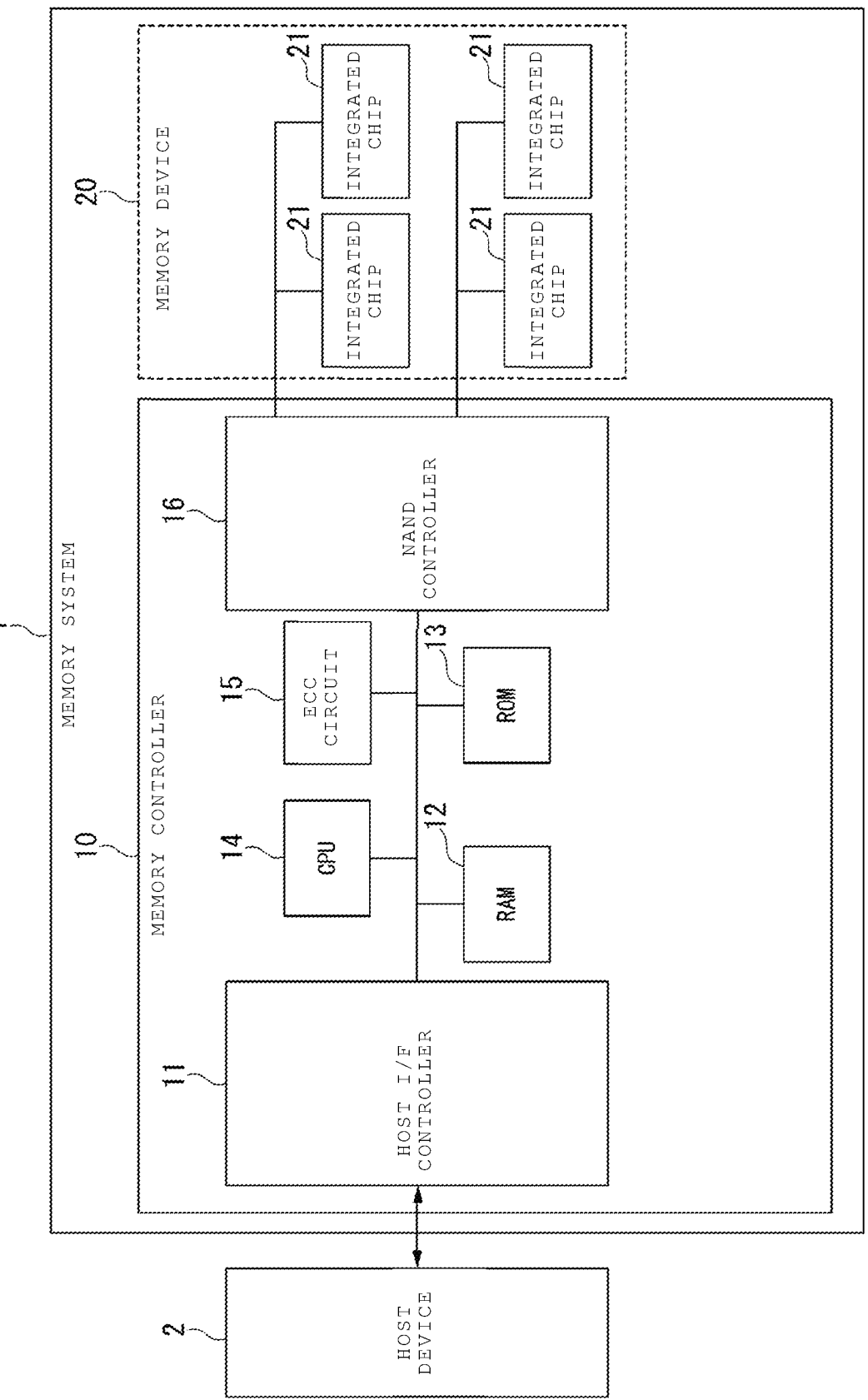
FIG. 1 is a block diagram illustrating a circuit configuration of a semiconductor storage device according to an embodiment.

FIG. 1 is a block diagram illustrating a circuit configuration of a memory system 1. The memory system 1 is, for example, a storage device and is connected to a host device 2. The host device 2 is, for example, a server device, a personal computer, or a mobile information processing device (e.g., a smart phone or tablet computer). The memory system 1 functions as an external storage device of the host device 2. The host device 2 issues an access request (such as a read request or a write request) to the memory system 1.

The memory system 1 includes a memory controller 10 and a memory device 20. The memory controller 10 and the memory device 20 are connected to each other by a plurality of channels.

The memory controller 10 includes a host interface controller 11 (host I/F controller 11), a random access memory (RAM) 12, a read only memory (ROM) 13, a central processing unit (CPU) 14, an error correcting code (ECC) circuit 15, and a NAND controller 16. The functional units are connected to each other by a bus. For example, the memory controller 10 is implemented by a system-on-a-chip (SoC) in which the above components are integrated into one chip. Some of the above functional units may be provided outside of the memory controller 10.

Under a control of the CPU 14, the host I/F controller 11 controls communication between the host device 2 and the memory system 1 and controls data transfers between the host device 2 and the RAM 12.

The RAM 12 is, for example, a dynamic random access memory (DRAM) or a static random access memory (SRAM). The RAM 12 functions as a buffer for data transfer between the host device 2 and the memory device 20. The RAM 12 also provides a work area for the CPU 14. Firmware (also referred to as a program or control program) stored in the ROM 13 is loaded into the RAM 12 when the memory system 1 operates.

The CPU 14 is an example of a hardware processor. The CPU 14 controls the entirety of the memory controller 10, for example, by executing the firmware. For example, the CPU 14 controls operations related to writing, reading, and deleting of data into and from the memory device 20.

The ECC circuit 15 encodes data to be written into the memory device 20 in order to correct an error. When data read out from the memory device 20 has an error, the ECC circuit 15 performs error correction on the read data based on an error correcting code given in a write operation.

The NAND controller 16 controls data transfer between the RAM 12 and the memory device 20 under a control of the CPU 14. The NAND controller 16 corresponds to a physical layer of the memory controller 10 and includes a transmission and reception circuit. The NAND controller 16 converts a digital signal transmitted from the memory controller 10 to the memory device 20 into an electric signal and transmits the electric signal obtained by the conversion to the memory device 20 via a transmission line. The NAND controller 16 receives an electric signal from the memory device 20 via the transmission line and converts the received electric signal into a digital signal.

In the embodiment, the NAND controller 16 has a plurality of channels. Each channel is connected to a plurality of memory devices 20. In some examples, only one channel may be provided. Likewise, in some examples, only one memory device 20 is connected to each channel.

Figure 2:
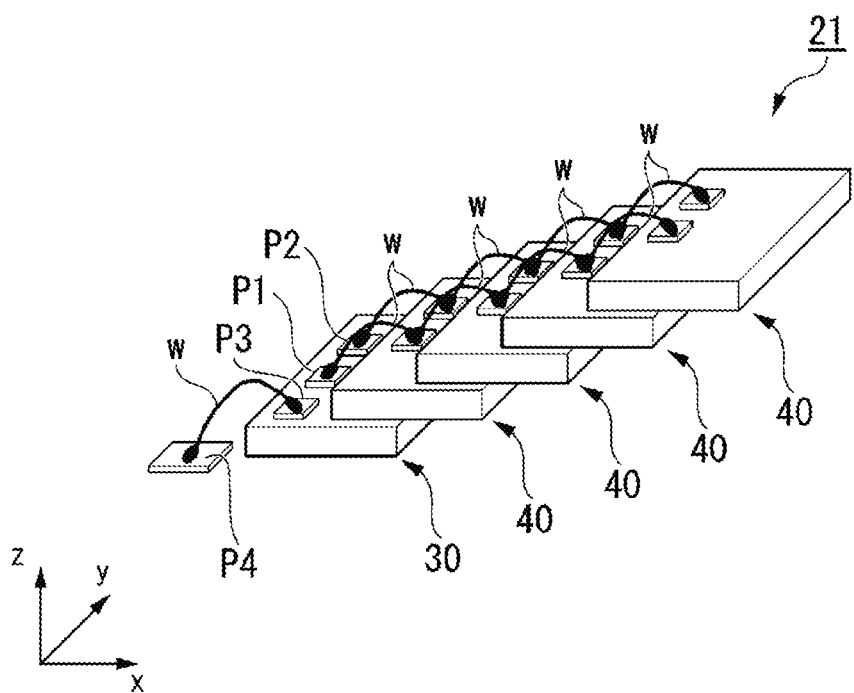
FIG. 2 illustrates a perspective view of an integrated chip according to an embodiment.

The memory device 20 includes a plurality of integrated chips 21. FIG. 2 illustrates a perspective view of an integrated chip 21 according to the embodiment. The integrated chip 21 includes a circuit chip 30 and a plurality of memory chips 40. The plurality of memory chips 40 are stacked on the circuit chip 30 in the z-direction. FIG. 2 illustrates an example in which four memory chips 40 are provided. The number of memory chips 40 is not limited to this example. The order of stacking the circuit chip 30 and the memory chip 40 does not matter.

Each of the circuit chip 30 and the memory chip 40 includes a first pad P1 and a second pad P2. The circuit chip 30 includes a third pad P3, and the third pad is connected to a fourth pad P4 on a printed circuit board or the like. The first pad P1 is a pad for supplying power to the circuit chip 30 or the memory chip 40. The second pad P2 is a pad for transmitting a signal to the circuit chip 30 or the memory chip 40. The third pad P3 and the fourth pad P4 are pads for supplying the power to the circuit chip 30. In FIG. 2, the first pads P1 are connected to each other by bonding wires W, and the second pads P2 are also connected to each other by bonding wires W. A bonding wire W is an example of a wired signal line and a power line.

Figure 3:
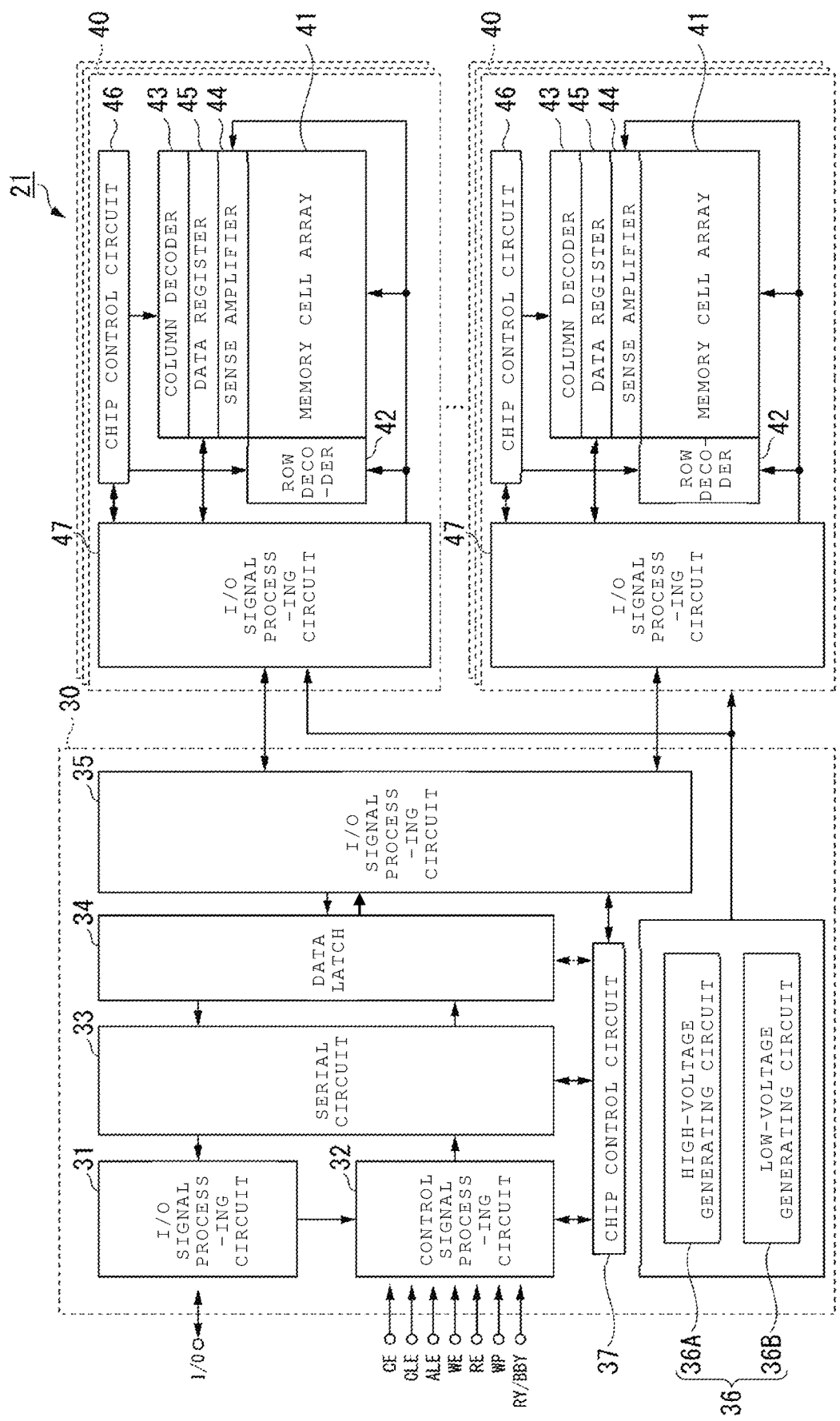
FIG. 3 is a block diagram illustrating a circuit configuration of the integrated chip according to an embodiment.

FIG. 3 is a block diagram illustrating a circuit configuration of the integrated chip 21 according to the embodiment. The integrated chip 21 includes the circuit chip 30 and the plurality of memory chips 40. The circuit chip 30 and each of the memory chips 40 are connected to each other by a signal line, and thus transmit and receive a signal to and from each other.

For example, the circuit chip 30 includes I/O signal processing circuits 31 and 35, a control signal processing circuit 32, a serial circuit 33, a data latch 34, a voltage generating circuit 36, and a chip control circuit 37.

The I/O signal processing circuit 31 is a buffer circuit configured to cause the memory controller 10 and the integrated chip 21 to transmit and receive I/O signals to and from each other. The I/O signal processing circuit 31 receives a signal from the memory controller 10 or an external power source and outputs data in the integrated chip 21 to the memory controller 10. The I/O signal processing circuit 31 is connected to one or more I/O signal lines for transmit data, an address, and various instructions. For example, eight I/O signal lines are provided between the memory controller 10 and the integrated chip 21, and a signal is transmitted at a high speed of about 1 GHz.

The control signal processing circuit 32 is connected to control signal lines. The control signal lines include a chip enable (CE) signal line, a write enable (WE) signal line, a read enable (RE) signal line, a command latch enable (CLE) signal line, an address latch enable (ALE) signal line, a write protect (WP) signal line, and an ready/busy (RY/BY) signal line, and the like. The CE signal line is used to transmit a signal indicating that the memory chip performs a selection operation. In the RY/BY signal line, whether or not the memory device 20 is operating is indicated by a level of a signal. For example, a High level indicates a ready state (RY) meaning that the memory device is not operated. A Low level indicates a busy state (BY) meaning that the memory device is operating. The control signal processing circuit 32 receives a control signal and allocates a storing destination of the I/O signal received by the I/O signal processing circuit 31, based on the received control signal.

The serial circuit 33 converts data of a page (may be referred to as "page data") in the memory cell array 41 into data for transfer and transfers the converted data. For example, the serial circuit 33 transmits page data to a data register 45 in each of the memory chips 40. The serial circuit 33 outputs I/O signals from the I/O signal processing circuit 31 and 35 in series at a high speed.

The data latch 34 stores the I/O signal from the I/O signal processing circuits 31 and 35. The data latch 34 performs an arithmetic operation on the I/O signal and allocates the resultant of the arithmetic operation to each page of the memory cell array 41 in each of the memory chips 40. A page is a unit in which data is written in and/or read from the memory cell array 41. The page includes a plurality of bits.

The I/O signal processing circuit 35 is a buffer circuit configured to cause the circuit chip 30 and each of the memory chips 40 to transmit and receive an I/O signal to and from each other. The I/O signal processing circuit 35 is connected to one or more I/O signal lines for transmit data, an address, and various instructions. The number of I/O signal lines between the circuit chip 30 and each of the memory chips 40 is, for example, 10 or more and 200 or less. A signal is transmitted in the I/O signal line at a speed of about 100 MHz. A transmission speed of a signal between the circuit chip 30 and the memory chip 40 is slower than a transmission speed of a signal between the memory controller 10 and the integrated chip 21.

The voltage generating circuit 36 generates a voltage required for reading data, writing data, and deleting data. The voltage generating circuit 36 includes, for example, a high-voltage generating circuit 36A and a low-voltage generating circuit 36B. The voltage generating circuit 36 generates voltages to be applied to the memory cell array 41, a row decoder 42, and a sense amplifier 44. The low-voltage generating circuit 36B generates a reference voltage. The low-voltage generating circuit 36B also reduces the voltage. The high-voltage generating circuit 36A increases the reference voltage to generate a high voltage. The voltage generating circuit 36 is connected to a power line in the circuit chip 30.

The chip control circuit 37 controls the circuits in the circuit chip 30. For example, the chip control circuit 37 controls the control signal processing circuit 32, the serial circuit 33, the data latch 34, and the I/O signal processing circuit 35.

For example, each of the memory chips 40 includes the memory cell array 41, the row decoder 42, a column decoder 43, the sense amplifier 44, the data register 45, a chip control circuit 46, and an I/O signal processing circuit 47.

The memory cell array 41 includes a plurality of memory cells MT and stores data. The memory cell array 41 is, for example, a so-called three-dimensional NAND memory in which the plurality of memory cells MT are three-dimensionally arranged. The description will be made below using an example in which the memory cell array 41 is an NAND memory, but the memory cell array 41 is not limited to the NAND memory. For example, the memory cell array 41 may be a magnetoresistive random access memory (MRAM), a NOR flash memory, a phase change material (PCM) memory, or a resistance change memory (ReRAM).

Figure 4:
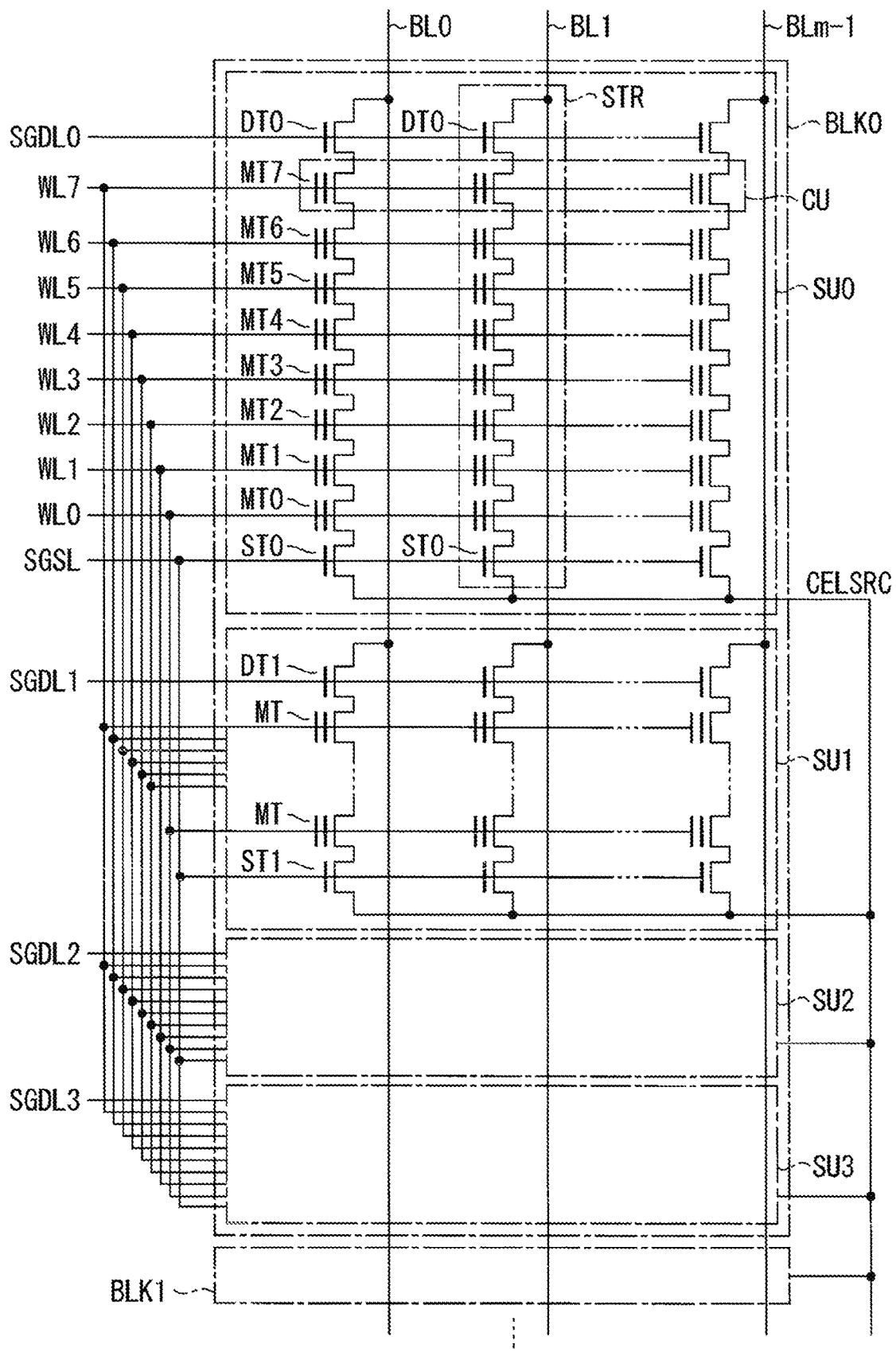
FIG. 4 is a circuit diagram illustrating a memory cell array of an integrated chip according to an embodiment.

FIG. 4 is a circuit diagram illustrating the memory cell array according to the embodiment. The memory cell array 41 includes a plurality of blocks BLK (BLK0, BLK1, and the like). For example, the memory cell array 41 includes hundreds to thousands of blocks BLK.

As illustrated in FIG. 4, the respective m bit lines BL (BL0 to BLm−1) (m is a natural number) are connected to a plurality (for example, four) of strings STR in each block BLK. Each of the strings STR includes one first select gate transistor ST (ST0 to ST3), a plurality of memory cells MT (MT0 to MT7), and one second select gate transistor DT (DT0 to DT3). The first select gate transistor ST, the plurality of memory cells MT, and the second select gate transistor DT are connected in series between a source line CELSRC and one bit line BL in this order. A plurality (m pieces) of strings STR respectively connected to the plurality of bit lines BL (BL0 to BLm−1) different from each other constitute one string unit SU. Each block BLK includes a plurality (for example, four) of string units SU (SU0 to SU3).

A control gate electrode of the first select gate transistor ST is connected to a first select gate line (source-side select gate line) SGSL. The first select gate line SGSL is a control signal line configured to control the control gate electrode of the first select gate transistor ST. The first select gate transistor ST is selectively connected between the plurality of memory cells MT and the source line CELSRC, based on a voltage applied through the first select gate line SGSL. The first select gate line SGSL may be independently connected to each string unit SU (SU0 to SU3).

A control gate electrode of the second select gate transistor DT is connected to a second select gate line (drain-side select gate line) SGDL (SGDL0 to SGDL3). The second select gate line SGDL is a control signal line configured to control the control gate electrode of the second select gate transistor DT. The second select gate transistor DT is selectively connected between the plurality of memory cells MT and the bit line BL, based on a voltage applied through the second select gate line SGDL.

Each of the memory cells MT (also referred to as memory cell transistors) is implemented as a metal oxide semiconductor field effect transistor (MOSFET) having a stacked gate structure. The memory cell MT includes a control gate and a charge storage film and stores data in a nonvolatile manner. The memory cell MT stores charges in the charge storage film depending on a voltage applied to the control gate.

In each block BLK, the control gate electrode of the memory cell MT is connected to the corresponding word line WL. For example, word lines WL0 to WL7 are connected to the control gate electrodes of the memory cells MT0 to MT7, respectively. Each word line WL is a control signal line configured to select one group of memory cells MT arranged in one row in the memory cell array 41. Each world line WL is connected to a group of memory cells MT arranged in one row. The word lines WL0 to WL7 are connected to the row decoder 42. Each o memory cell MT is provided at an intersection between a word line WL and a bit line BL (BL0 to BLm−1). Reading or writing from or into the memory cell MT is possible if a certain voltage is applied to the word line WL connected to the memory cell MT on which reading or writing is performed.

In each block BLK, the word line WL corresponding to the same address is connected to a plurality of memory cells MT in the different strings STR. A set of memory cells MT sharing the same word line WL is referred to as a cell unit CU. Data is collectively written to and is also collectively read from the memory cells MT in the same cell unit CU. A storage space of one cell unit CU corresponds to one or a plurality of pages.

The row decoder 42 selects one block BLK based on address information received from the I/O signal processing circuit 47. The row decoder 42 applies a desired voltage to each of the plurality of word lines to perform a write operation and a read operation of data on the memory cell array 41.

The column decoder 43 selects and activates (energizes) a predetermined bit line based on the address information received from the I/O signal processing circuit 47.

The sense amplifier 44 senses the state of the memory cell MT (see FIG. 3) in the memory cell array 41 and generates read data based on the sensed state, in the read operation. The sense amplifier 44 stores the generated read data in the data register 45.

The data register 45 temporarily stores the read data sensed by the sense amplifier 44. The data register 45 includes a temporary data latch (TDL) that temporarily stores the read data. The TDL stores the sensed read data as it is, without converting the sensed read data into page data for writing and reading.

The chip control circuit 46 is a logical circuit that controls the row decoder 42 and the column decoder 43. The chip control circuit 46 controls the row decoder 42 and the column decoder 43 based on the address information received from the I/O signal processing circuit 47.

The I/O signal processing circuit 47 is a buffer circuit configured to cause the circuit chip 30 and each of the memory chips 40 to transmit and receive an I/O signal to and from each other. The read data stored in the TDL is transmitted to the I/O signal processing circuit 47, as it is. The read data transmitted to the I/O signal processing circuit 47 is transmitted to the I/O signal processing circuit 35 in the circuit chip 30, as it is. The read data stored in the TDL is subjected to an arithmetic operation by the data latch 34 in the circuit chip 30 and is stored for each piece of page data.

In the integrated chip 21 according to the embodiment, a portion of a peripheral circuit that controls the memory cell array 41 is provided in the circuit chip 30 separate from the memory chip 40. The portion of the peripheral circuit means the control signal processing circuit 32, the data latch 34, and the voltage generating circuit 36, for example. The data latch 34 that stores data for each piece of page data and the high-voltage generating circuit 36A that generates a high voltage require a wide area, and thus have a large footprint in a wafer. Since the circuit chip 30 in which the control signal processing circuit 32, the data latch 34, and the voltage generating circuit 36 are shared by the plurality of memory chips 40 is separately provided, the number of elements constituting the memory chip 40 is reduced. In addition, by stacking the circuit chip 30 with the memory chips 40, it is possible to reduce the size (e.g., footprint) of one integrated chip 21.

If the number of I/O signal lines between the circuit chip 30 and the memory chip 40 increases, for example, up to about 100, it is possible to lower an operation frequency when a signal is transmitted between the circuit chip 30 and the memory chip 40. When a transmission frequency is low (for example, about 100 MHz), it is possible to perform processing even though the performance of a transmission transistor is low. A high-performance transistor is one of causes of an increase in wafer cost, and thus it is possible to reduce the wafer cost by lowering the performance of the transistor.

The bit cost means manufacturing cost per storage capacity. The bit cost is determined by the product of the wafer cost and the chip size. Thus, in the integrated chip 21 according to the embodiment, it is possible to reduce the bit cost.

First Modification Example

An integrated chip according to a first modification example is different from the integrated chip 21 illustrated in FIG. 2 in that each of a signal line and a power line in the memory chip 40 and the circuit chip 30 includes a via wiring V, and that each of signal line connection and power line connection between the memory chip 40 and the circuit chip 30 and between the memory chips 40 includes a micro-bump MB. The via wiring V is an example of a through wiring (e.g., a through silicon via (TSV)). Other components are similar to those in the integrated chip 21 in the embodiment.

Figure 5:
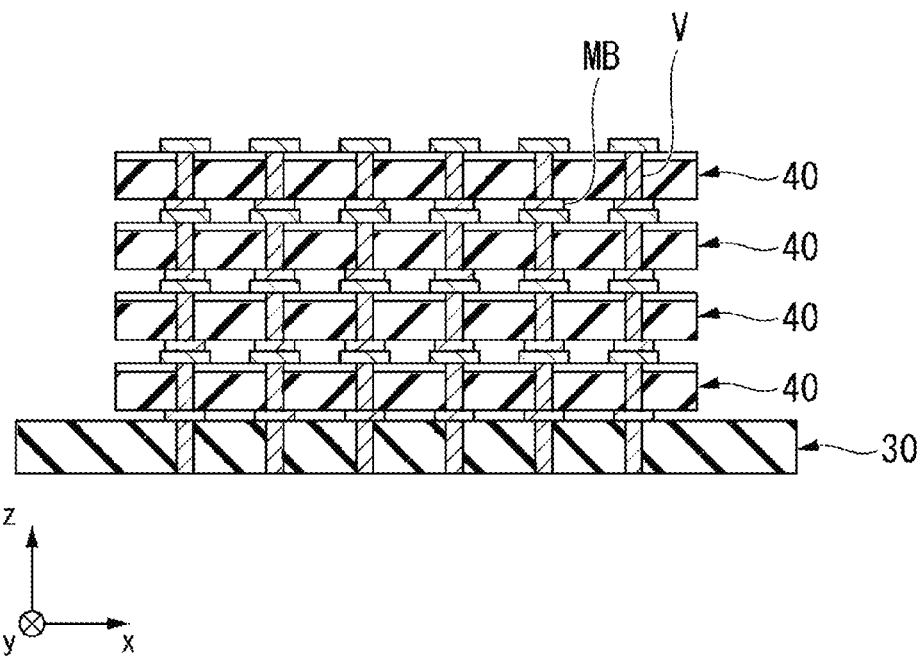
FIG. 5 illustrates a cross-sectional view of memory chips and a circuit chip that are stacked in a semiconductor storage device according to a first modification example.

FIG. 5 illustrates a cross-sectional view of the memory chip 40 and the circuit chip 30 that are stacked in the integrated chip in the first modification example. A plurality of memory chips 40 are stacked on the circuit chip 30. A plurality of via wirings V penetrate into the memory chip 40 and the circuit chip 30 in the stacking direction. Each via wiring V is a conductor filled into an opening formed in the insulating layer. A via wiring V can be used as a wired signal line or a power line.

The micro-bumps MB join adjacent memory chips 40 to each other or joins a memory chip 40 to the circuit chip 30. A micro-bump MB is an example of a wired signal line connection or power line connection. The via wiring V and the micro-bump MB electrically connect the circuit chip 30 and each of the memory chips 40 to provide the signal line or the power line.

With such a configuration, it is possible to reduce the bit cost of the integrated chip. Since the capacitance of the via wiring V is less than the capacitance of the wire, the power consumption of the integrated chip is reduced if the via wiring V is used.

Second Modification Example

An integrated chip according to a second modification example is different from the integrated chip 21 illustrated in FIG. 2 in that a signal line connection and a power line connection between the memory chip 40 and the circuit chip 30 are micro-bumps MB. Other components are similar to those in the integrated chip 21 in the embodiment.

Figure 6:
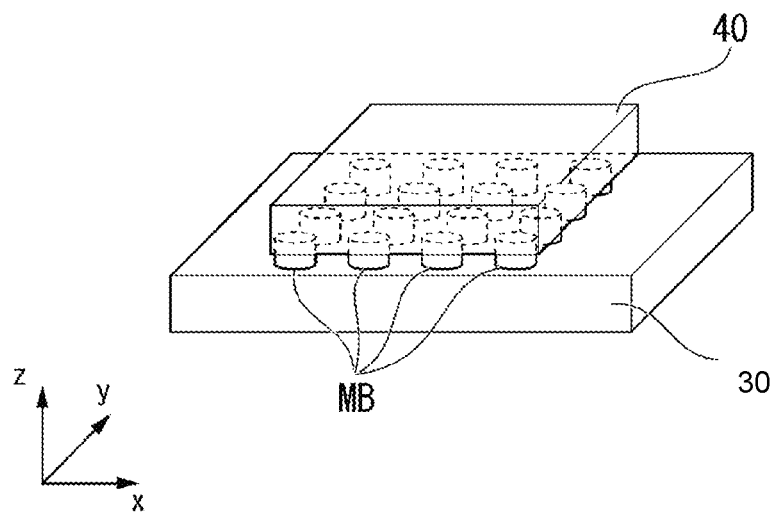
FIG. 6 illustrates a perspective view of an integrated chip in a semiconductor storage device according to a second modification example.
Figure 7:
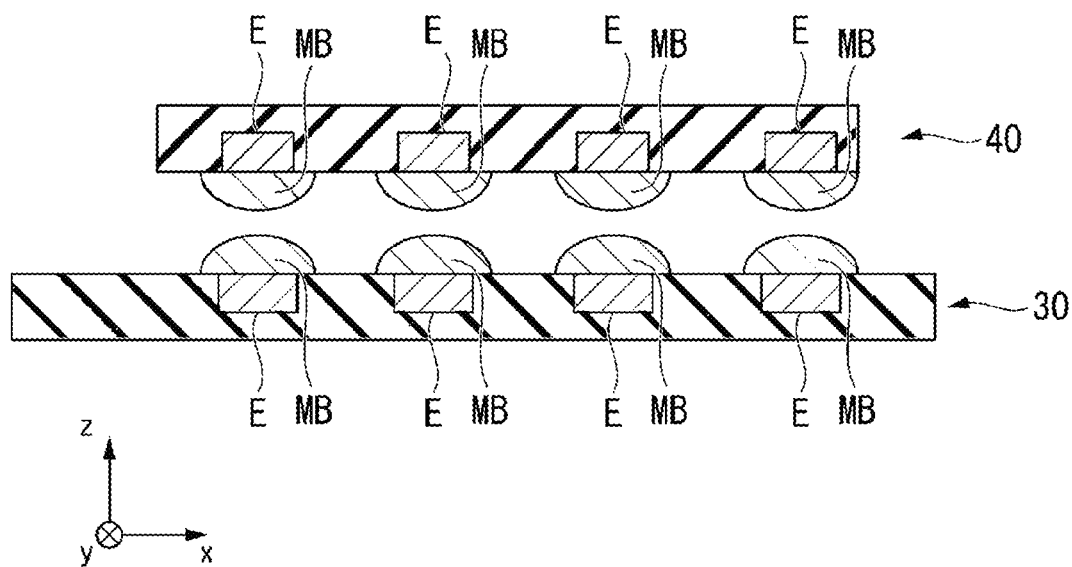
FIG. 7 illustrates an enlarged cross-sectional view of an interface between a memory chip and a circuit chip in a semiconductor storage device according to a second modification example.

FIG. 6 illustrates a perspective view of the integrated chip in the second modification example. FIG. 7 illustrates an enlarged cross-sectional view of an interface between the memory chip 40 and the circuit chip 30 in the integrated chip in the second modification example. FIG. 7 illustrates a state before the memory chip 40 and the circuit chip 30 are connected to each other. For example, the micro-bump MB formed on an electrode E of the circuit chip 30 is bonded to an electrode E of the memory chip 40. The circuit chip 30 is widened in the xy plane. One memory chip 40 is connected to the corresponding location on the circuit chip 30 through the micro-bumps MB. One or a plurality of memory chips 40 are provided. When the plurality of memory chips 40 are provided, for example, the plurality of memory chips 40 are arranged on the circuit chip 30. The micro-bump MB is used as a wired signal line or power line. If the micro-bumps MB are used, the number of I/O signal lines between the circuit chip 30 and the memory chip 40 is increased up to 100 or more and 10000 or less.

With such a configuration, it is also possible to reduce the bit cost of the integrated chip. If the number of I/O signal lines between the circuit chip 30 and the memory chip 40 increases, it is possible to further lower the transmission frequency. If the transmission frequency is lowered, it is not necessarily required to use a high-performance transistor for transmission, and thus the bit cost is reduced further. Since the number of I/O signal lines between the circuit chip 30 and the memory chip 40 increases, it is possible to increase a transmission amount of a signal between the circuit chip 30 and the memory chip 40. Many memory chips 40 may be provided in the integrated chip in order to increase the transmission amount from the memory chip 40. In such an integrated chip, if the transmission amount per one memory chip 40 increases, it is possible to reduce the number of memory chips 40 in the integrated chip. As a result, the bit cost of the integrated chip is reduced.

Third Modification Example

An integrated chip according to a third modification example is different from the integrated chip (FIG. 7) according to the second modification example in that a position where one or more micro-bumps MB is provided is shifted from the location of the electrode E of the circuit chip 30. Other components are similar to those in the integrated chip 21 in the embodiment.

Figure 8:
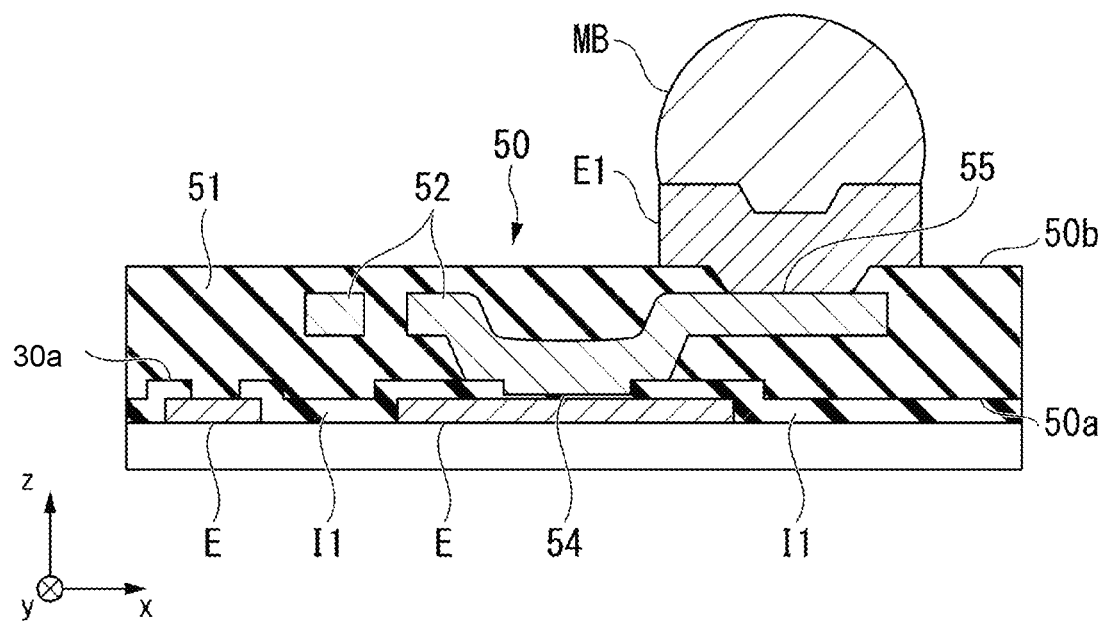
FIG. 8 illustrates an enlarged cross-sectional view of an interface between a memory chip and a circuit chip in a semiconductor storage device according to a third modification example.

In the circuit chip 30 illustrated in FIG. 8, an insulating layer I1 and the electrode E are exposed to a first surface 30a. A wiring layer 50 is provided on the first surface 30a of the circuit chip 30. The wiring layer 50 is provided between the circuit chip 30 and the memory chip 40. The wiring layer 50 includes an insulating layer 51 and a wiring 52. The wiring 52 is made of copper, for example.

The wiring 52 is exposed to a first surface 50a and a second surface 50b of the wiring layer 50. The first surface 50a faces the first surface 30a of the circuit chip 30. The second surface 50b is opposite to the first surface 50a. A portion of the wiring 52 is widened in the xy plane. The location of a first point 54 at which the wiring 52 is exposed in the first surface 50a is different from the location of a second point 55 at which the wiring 52 is exposed in the second surface 50b, in plan view from the z-direction. An electrode E1 and the micro-bump MB are provided on the second point 55.

With such a configuration, it is also possible to reduce the bit cost of the integrated chip. Since the exposure location of the wiring 52 varies in the first surface 50a and the second surface 50b, it is possible to electrically connect two chips even though the positions where the electrodes E are provided differ in the circuit chip 30 and the memory chip 40. Here, a case in which the wiring layer 50 is provided between the circuit chip 30 and the memory chip 40 has been described, but in other examples the wiring layer 50 may instead, or in addition, be provided between the memory chips 40 adjacent to each other.

Fourth Modification Example

Figure 9:
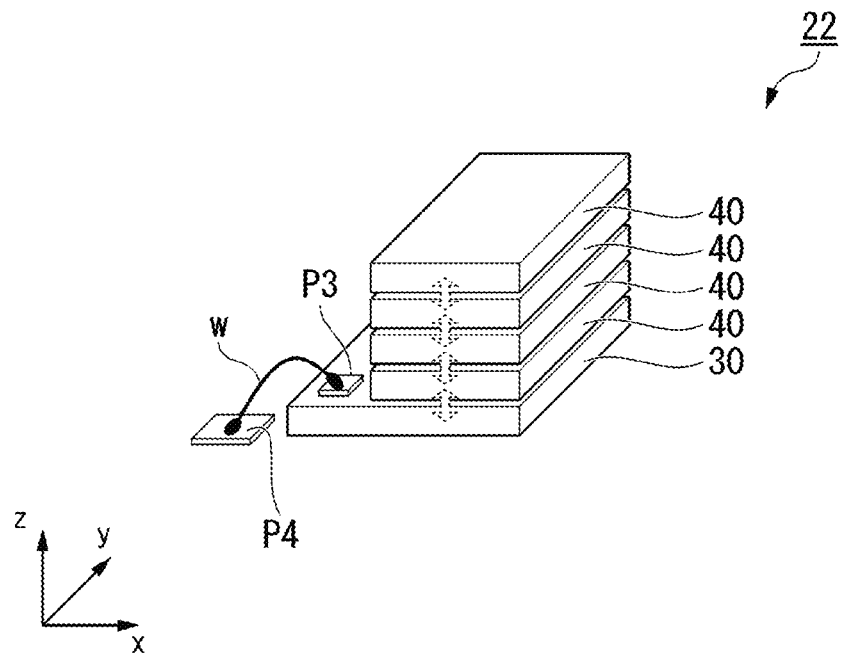
FIG. 9 illustrates a perspective view of an integrated chip according to a fourth modification example.

FIG. 9 illustrates a perspective view of an integrated chip 22 in a semiconductor storage device according to a fourth modification example. The integrated chip 22 according to the fourth modification example is different from the integrated chip 21 (illustrated in FIG. 2) in that the signal line and the power line connections between the memory chip 40 and the circuit chip 30 and between the memory chips 40 are not made by bonding wires (wires W). Other components are similar to those in the integrated chip 21 in the embodiment.

In the integrated chip 22, the signal line and the power line do not incorporate bonding wires. Since the signal line and the power line are provided without use of bonding wires, the first pad P1 and the second pad P2 are not required. With such a configuration, it is also possible to reduce the bit cost of the integrated chip.

Fifth Modification Example

Figure 10:
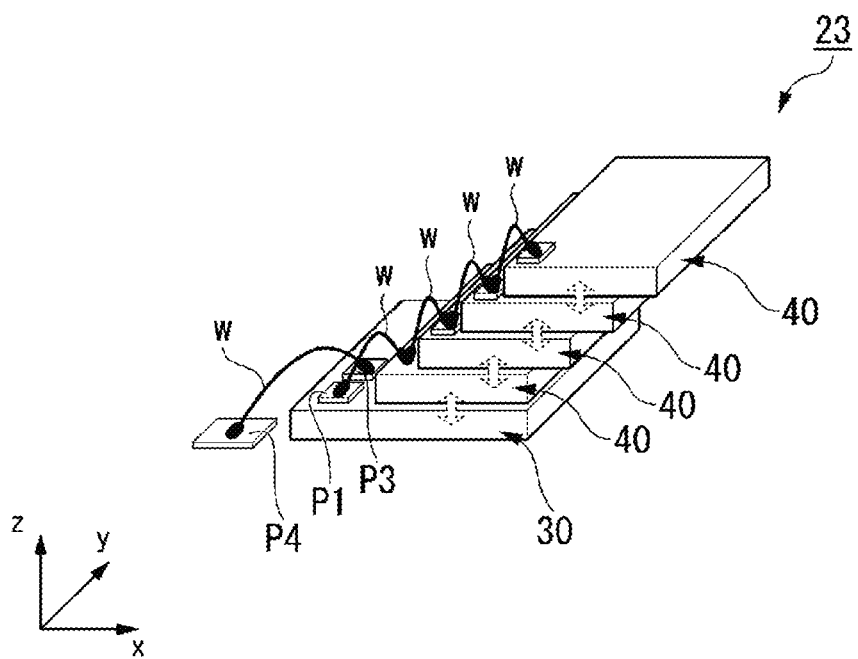
FIG. 10 illustrates a perspective view of an integrated chip according to a fifth modification example.

FIG. 10 illustrates a perspective view of an integrated chip 23 in a semiconductor storage device according to a fifth modification example. The integrated chip 23 according to the fifth modification example is different from the integrated chip 21 (illustrated in FIG. 2) in that the signal line connection between the memory chip 40 and the circuit chip 30 and between the memory chips 40 does not utilize bonding wires; however, the power line is a wired connection. Other components are similar to those in the integrated chip 21 in the embodiment.

In the integrated chip 23, the signal line connection does not use bonding wires, but the power line does. FIG. 10 illustrates a case where the power line is a bonding wire. Since the signal line is provided in a wireless manner (that is, the signal line is not a bonding wire, but rather a connection made with a micro bump MB and/or a via wiring V), the second pad P2 is not required. However, since the power line is provided in a wired manner, current transmission between large-current chips is still easily performed. With such a configuration, it is also possible to reduce the bit cost of the integrated chip.

Sixth Modification Example

Figure 11:
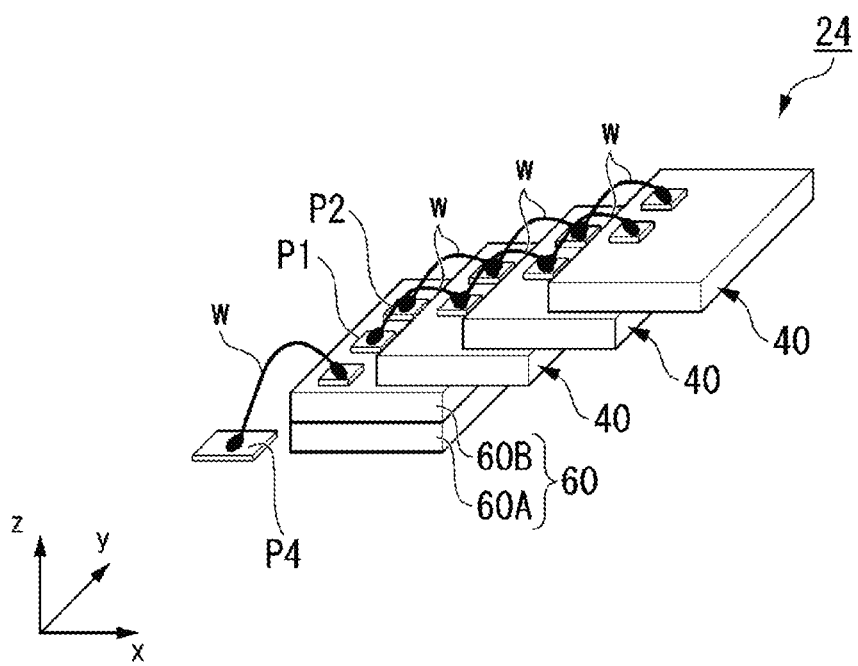
FIG. 11 illustrates a perspective view of an integrated chip according to a sixth modification example.
Figure 12:
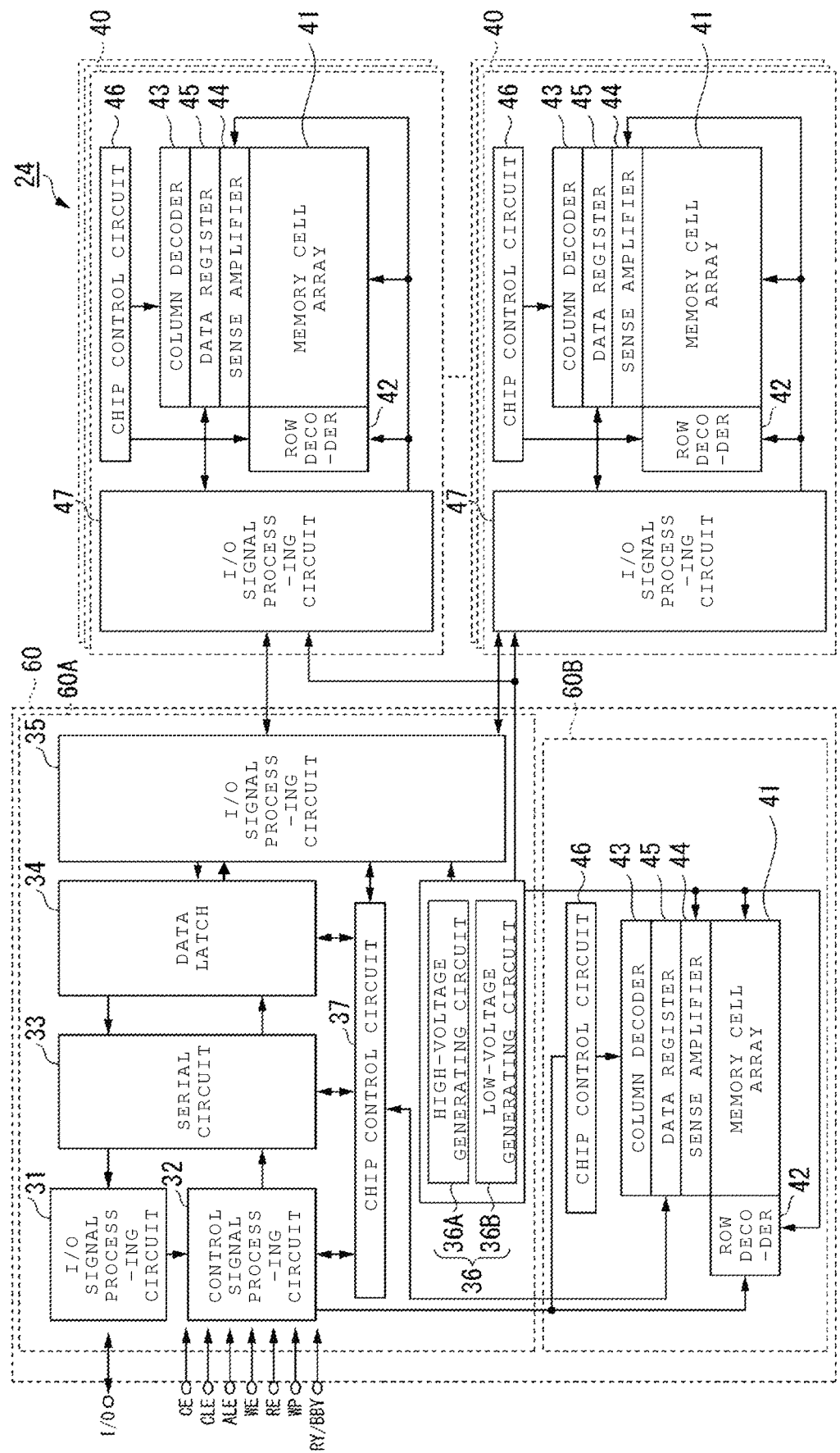
FIG. 12 is a block diagram illustrating a circuit configuration of an integrated chip according to a sixth modification example.

FIG. 11 illustrates a perspective view of an integrated chip 24 in a semiconductor storage device according to a sixth modification example. FIG. 12 is a circuit diagram illustrating the integrated chip 24 in the sixth modification example. The integrated chip 24 according to the sixth modification example is different from the integrated chip 21 illustrated in FIGS. 2 and 3 in that a circuit chip 60 includes a memory layer 60B. Other components are similar to those in the integrated chip 21 in the embodiment.

The integrated chip 24 includes the circuit chip 60 and a plurality of memory chips 40. The circuit chip 60 includes a circuit layer 60A and the memory layer 60B. The memory layer 60B is stacked on the circuit layer 60A, for example. For example, the circuit layer 60A and the memory layer 60B are bonded to each other to be electrically connected to each other. The circuit layer 60A has a configuration similar to the circuit chip 30. The memory layer 60B includes the memory cell array 41, the row decoder 42, the column decoder 43, the sense amplifier 44, the data register 45, and the chip control circuit 46.

The sense amplifier 44 senses data of the memory cell array 41 in the memory layer 60B, and the sensed read data is temporarily stored in the data register 45. The data temporarily stored in the data register is transmitted, as it is, to the serial circuit 34, is subjected to an arithmetic operation by the data latch 33, and is stored for each piece of page data. The chip control circuit 46 controls the operation of the components of the memory layer 60B.

With such a configuration, it is also possible to reduce the bit cost of the integrated chip.

Seventh Modification Example

Figure 13:
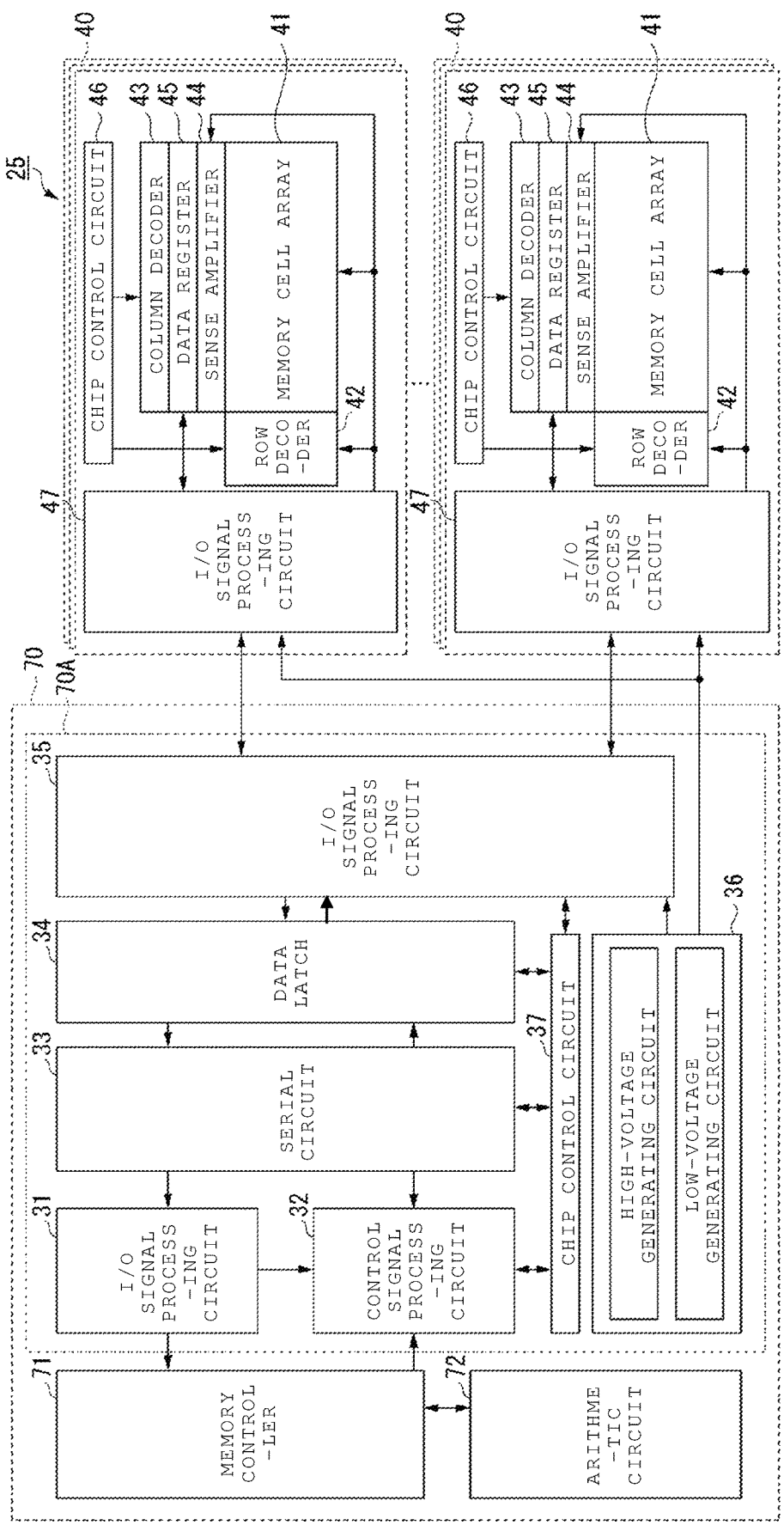
FIG. 13 is a block diagram illustrating a circuit configuration of an integrated chip according to a seventh modification example.

FIG. 13 is a circuit diagram illustrating an integrated chip 25 in a semiconductor storage device according to a seventh modification example. The integrated chip 25 according to the seventh modification example is different from the integrated chip 21 illustrated in FIG. 3 in that a circuit chip 70 includes a memory controller 71 and an arithmetic circuit 72. Other components are similar to those in the integrated chip 21 in the embodiment. The memory controller 71 is an example of a controller.

The integrated chip 25 includes a circuit area 70A, the memory controller 71, and the arithmetic circuit 72. The circuit area 70A is similar to the circuit chip 30. The memory controller 71 is similar to the memory controller 10. The arithmetic circuit 72 performs an arithmetic operation on a processing result of the memory controller 71 and learns from the processing result (e.g., performs a machine learning operation). The weighted data from the arithmetic circuit 72 is transmitted to the memory controller 71, and thus the processing of the memory controller 71 can be optimized.

With such a configuration, it is also possible to reduce the bit cost of the integrated chip. Since the circuit chip 70 performs some functions of the memory controller 10, each integrated chip 25 functions as a storage device. Since the circuit chip 70 includes the arithmetic circuit 72, it is possible to perform a system operation in a single circuit chip.

Eighth Modification Example

Figure 14:
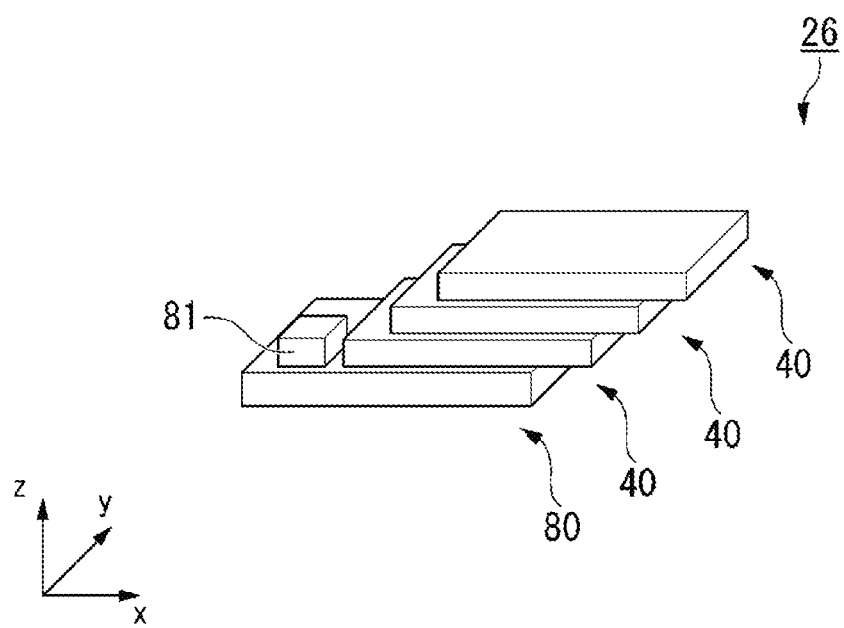
FIG. 14 illustrates a perspective view of an integrated chip according to an eighth modification example.
Figure 15:
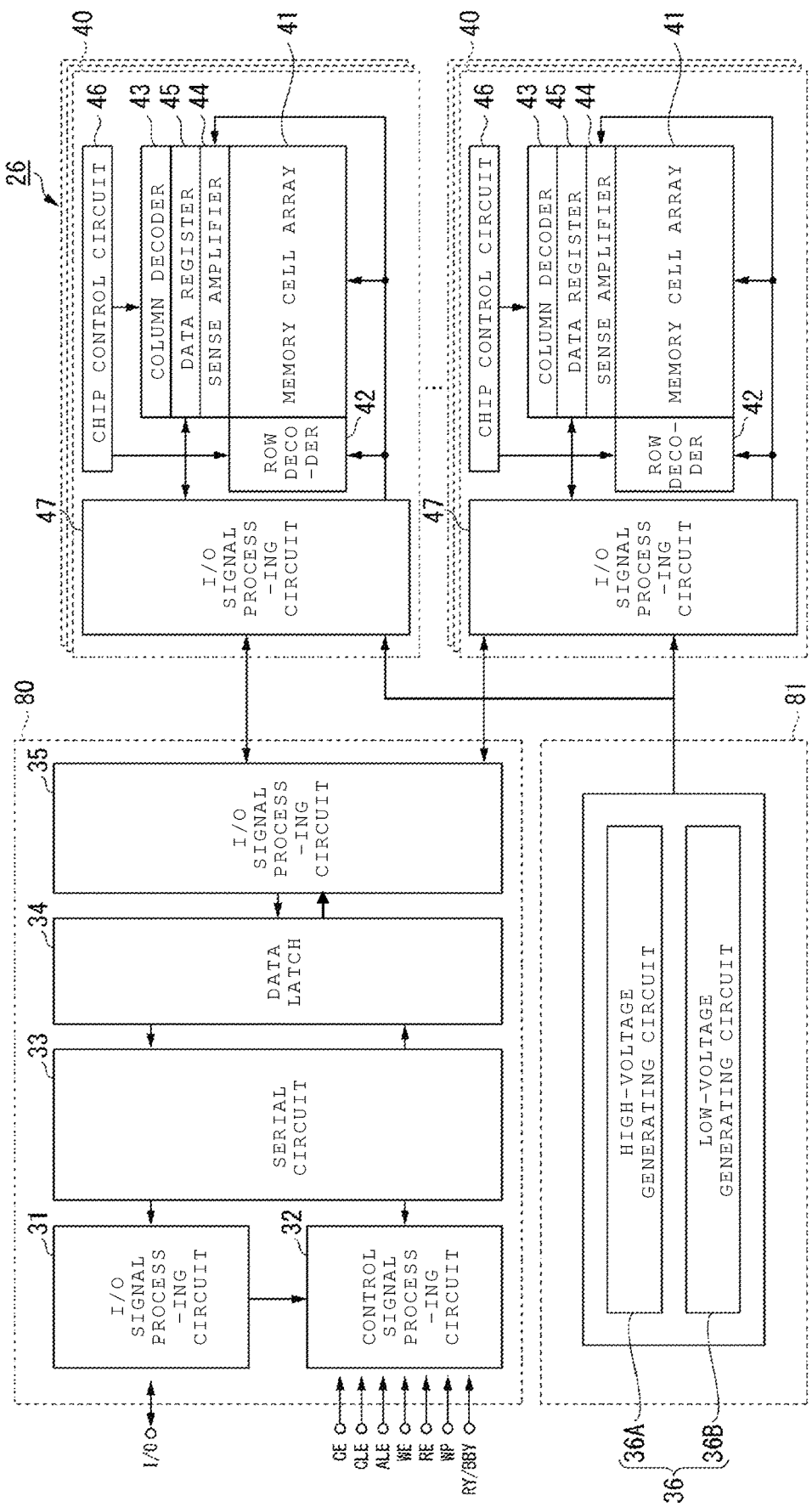
FIG. 15 is a block diagram illustrating a circuit configuration of an integrated chip according to an eighth modification example.

FIG. 14 illustrates a perspective view of an integrated chip 26 in a semiconductor storage device according to an eighth modification example. FIG. 15 is a circuit diagram illustrating an example of the integrated chip 26 in the eighth modification example. The integrated chip 26 according to the eighth modification example is different from the integrated chip 21 illustrated in FIG. 3 in that a circuit chip 80 does not include the voltage generating circuit 36, and a drive chip 81 including the voltage generating circuit 36 is provided as a separate chip. Other components are similar to those in the integrated chip 21 in the embodiment.

The integrated chip 26 includes the circuit chip 80, the drive chip 81, and the plurality of memory chips 40. The drive chip 81 is stacked on the circuit chip 80. The power line connection and the signal line connection between the drive chip 81 and the circuit chip 80 may be made with bonding wires or otherwise. The plurality of memory chips 40 are stacked on the circuit chip 80 at a location different from the location of the drive chip 81. The circuit chip 80 is similar to circuit chip 30 excepting that the circuit chip 80 does not include the voltage generating circuit 36. The drive chip 81 includes the voltage generating circuit 36. The drive chip 81 is electrically connected to each of the memory chips 40. The voltage generating circuit 36 in the drive chip 81 generates a voltage required for reading data, writing data, and deleting data in each of the memory chips 40.

With such a configuration, it is also possible to reduce the bit cost of the integrated chip.

Figure 16:
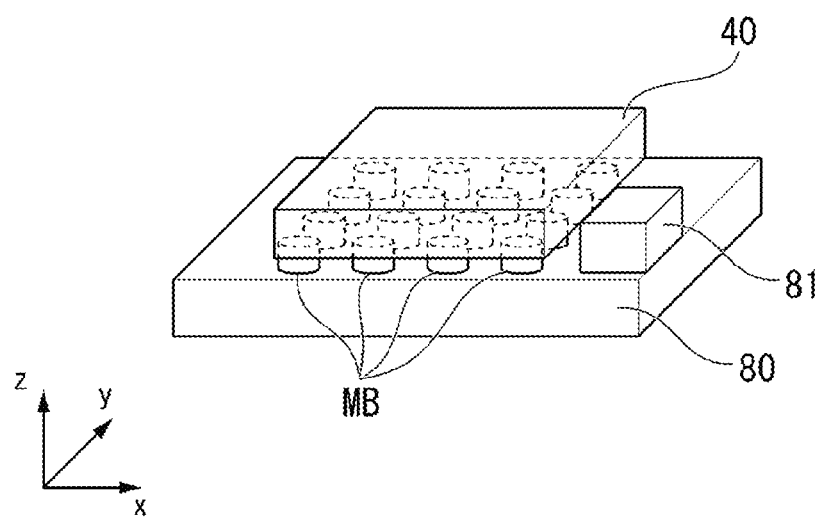
FIG. 16 illustrates a perspective view of another integrated chip according to an eighth modification example.

FIG. 16 illustrates a perspective view of another example of the integrated chip in the eighth modification example. In the integrated chip illustrated in FIG. 16, the power line and the signal line between the circuit chip 80 and the memory chip 40 are micro-bumps MB. The circuit chip 80 is widened in the xy plane. The drive chip 81 is stacked on the circuit chip 80. The memory chip 40 is stacked on the circuit chip 30 at a different location from the drive chip 81. One or a plurality of memory chips 40 are provided. When the plurality of memory chips 40 are provided, for example, the plurality of memory chips 40 are spread on the circuit chip 30.

Ninth Modification Example

Figure 17:
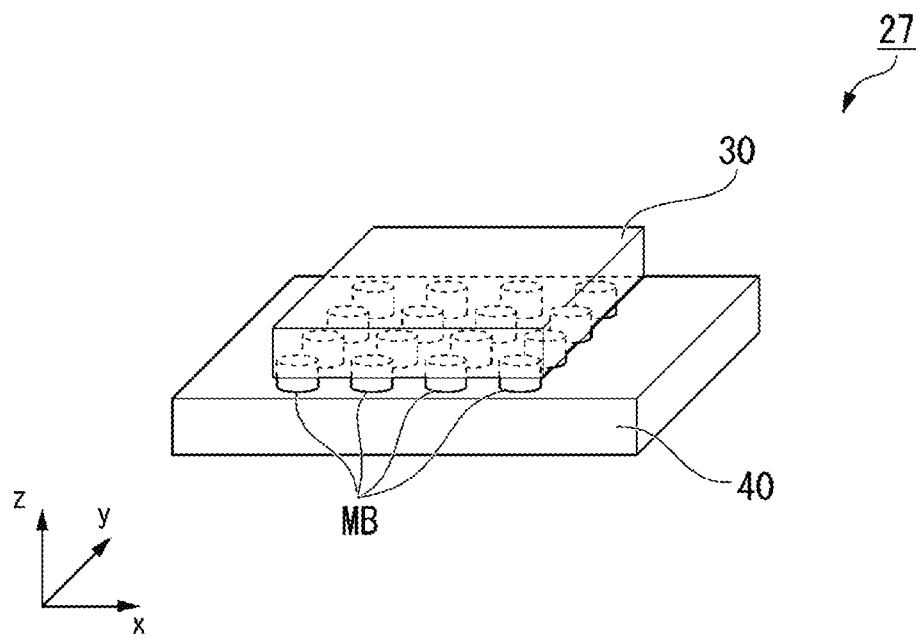
FIG. 17 illustrates a perspective view of an example of an integrated chip in a semiconductor storage device according to a ninth modification example.

FIG. 17 illustrates a perspective view of an integrated chip 27 in a semiconductor storage device according to a ninth modification example. The integrated chip 27 according to the ninth modification example is different from the integrated chip illustrated in FIG. 6 in that the circuit chip 30 is stacked on the memory chip 40.

An order of stacking the circuit chip 30 and the memory chip 40 in the integrated chip does not matter. FIG. 17 illustrates a case where the location relation between the circuit chip 30 and the memory chip 40 is reversed from the location relation in FIG. 6, by using an example in which the connection between the circuit chip 30 and the memory chip 40 is performed with the micro-bump MB. However, the location relation between the circuit chip 30 and the memory chip 40 is not limited to this case and may be applied in any of the embodiment and the modification examples.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a plurality of memory chips, the memory chips each having a memory cell array that includes a plurality of memory cells, a data register, and a first input/output (I/O) signal processing circuit; and
   a circuit chip including a data latch configured to store data in unit of page data and a second I/O signal processing circuit, wherein
   during a read operation, the data latch receives data read from the memory cell array of one of the memory chips via the data register, the first I/O signal processing circuit, and the second I/O signal processing circuit thereof and stores the received data in unit of page data, and
   the plurality of memory chips and the circuit chip are stacked on each other in a stacking direction.

2. The semiconductor storage device according to claim 1, wherein the memory chips lack any data latch therein.

3. The semiconductor storage device according to claim 1, wherein the circuit chip includes a voltage generating circuit configured to generate a voltage to be applied to the memory cell array of each of the memory chips.

4. The semiconductor storage device according to claim 3, wherein the memory chips have no voltage generating circuit therein.

5. The semiconductor storage device according to claim 1, further comprising:
   a drive chip including a voltage generating circuit configured to generate a voltage to be applied to the memory cell array of each of the memory chips.

6. The semiconductor storage device according to claim 5, wherein the plurality of memory chips and the drive chip are stacked on a same side of the circuit chip.

7. The semiconductor storage device according to claim 1, wherein the circuit chip includes a control signal processing circuit connected to a write enable signal line and a read enable signal line.

8. The semiconductor storage device according to claim 7, wherein the memory chips lack a control signal processing circuit directly connected to the write enable signal line and the read enable signal line.

9. The semiconductor storage device according to claim 1, wherein the circuit chip includes a signal line through which the page data are transferred to each of the memory chips, and a power line through which power is transferred to each of the memory chips.

10. The semiconductor storage device according to claim 9, wherein the power line is connected to at least one of the memory chips by a bonding wire and the signal line is connected to at least one of the memory chips by a micro bump.

11. The semiconductor storage device according to claim 9, wherein the signal line is connected to at least one of the memory chips by a micro bump and the power line is connected to at least one of the memory chips by a micro bump.

12. The semiconductor storage device according to claim 1, further comprising:
   a wiring layer between the circuit chip and the one of the plurality of memory chips directly on the circuit chip, wherein
   the wiring layer includes an insulating layer and a wiring in the insulating layer,
   the wiring has a first surface portion not covered by the insulating layer and facing the circuit chip and a second surface portion not covered by the insulating layer and facing the one of the plurality of memory chips, and
   the second surface portion is shifted in position from a position of the first surface portion in a direction perpendicular to the stacking direction.

13. The semiconductor storage device according to claim 1, wherein
the circuit chip includes a circuit layer including the data latch and a memory layer including a memory cell array that includes a plurality of memory cells, and
the circuit layer and the memory layer are stacked on each other in the stacking direction.

14. The semiconductor storage device according to claim 1, wherein the circuit chip further includes a memory control circuit configured to receive data from and transfer data to a host device.

15. The semiconductor storage device according to claim 14, wherein the circuit chip further includes an arithmetic circuit configured to perform a machine learning operation based on an operation result of the memory control circuit.

16. The semiconductor storage device according to claim 1, further comprising:
a memory controller chip including a memory control circuit configured to receive data from and transfer data to a host device.

17. The semiconductor storage device according to claim 1, wherein
the circuit chip includes a signal line, through which the page data are transferred to each of the plurality of memory chips, and a power line, through which power is transferred to each of the plurality of memory chips, and
the plurality of memory chips includes a first memory chip and a second memory chip stacked between the first memory chip and the circuit chip,
the second memory chip includes a first through silicon via (TSV) through which the signal line and the first memory chip are electrically connected and a second TSV through which the power line and the first memory chip are electrically connected.

18. The semiconductor storage device according to claim 1, wherein
the circuit chip includes a signal line, through which the page data are transferred to each of the plurality of memory chips, and a power line, through which power is transferred to each of the plurality of memory chips,
the plurality of memory chips includes a first memory chip directly stacked on the circuit chip, and
the signal line is electrically connected to the first memory chip via a first micro-bump between the circuit chip and the first memory chip, and the power line is electrically connected to the first memory chip via a second micro-bump between the circuit chip and the first memory chip.

* * * * *